(12) United States Patent
Harper, Jr.

(10) Patent No.: US 6,527,597 B1
(45) Date of Patent: Mar. 4, 2003

(54) MODULAR ELECTRICAL CONNECTOR

(75) Inventor: Donald K. Harper, Jr., Harrisburg, PA (US)

(73) Assignee: FCI Americas Technology, Inc., Reno, NV (US)

( * ) Notice: Subject to any disclaimer, the term of this patent is extended or adjusted under 35 U.S.C. 154(b) by 0 days.

(21) Appl. No.: 09/519,768

(22) Filed: Mar. 7, 2000

(51) Int. Cl.⁷ ............................................. H01R 13/625
(52) U.S. Cl. ...................................................... 439/701
(58) Field of Search ................................. 439/341, 342, 439/259–270, 347, 79, 74, 680, 83, 682, 701, 376, 924.1, 75

(56) References Cited

U.S. PATENT DOCUMENTS

| | | |
|---|---|---|
| 3,409,857 A | 11/1968 | O'Neill et al. |
| 3,771,109 A | 11/1973 | Bruckner et al. |
| 4,220,383 A | 9/1980 | Scheingold et al. |
| 4,341,429 A | 7/1982 | Bright et al. |
| 4,354,720 A | 10/1982 | Bakermans |
| 4,368,939 A | 1/1983 | Foederer |
| 4,504,105 A | 3/1985 | Barkus et al. |
| 4,552,422 A | 11/1985 | Bennett et al. |
| 4,679,118 A | 7/1987 | Johnson et al. ............. 361/386 |
| 4,744,009 A | 5/1988 | Grabbe et al. ............. 361/398 |
| 4,815,987 A | 3/1989 | Kawano et al. ............. 439/263 |
| 4,831,724 A | 5/1989 | Elliott .......................... 29/840 |
| 4,871,316 A | 10/1989 | Herrell et al. ................ 439/66 |
| 5,221,209 A | 6/1993 | D'Amico ..................... 439/71 |
| 5,295,870 A | 3/1994 | Rei et al. .................... 439/717 |
| 5,471,090 A | 11/1995 | Deutsch et al. ............. 257/734 |
| 5,516,030 A | 5/1996 | Denton .................. 228/180.22 |
| 5,564,932 A | 10/1996 | Castleman ................... 439/70 |
| 5,639,695 A | 6/1997 | Jones et al. ................. 437/209 |
| 5,649,836 A | * 7/1997 | Kashiwagi .................. 439/342 |
| 5,768,774 A | 6/1998 | Wilson et al. ................ 29/840 |
| 5,790,380 A | 8/1998 | Frankeny ..................... 361/735 |
| 5,796,170 A | * 8/1998 | Marcantonio ............... 257/786 |
| 5,859,474 A | 1/1999 | Dordi ......................... 257/737 |
| 5,876,219 A | * 3/1999 | Taylor et al. ................. 439/74 |
| 6,093,042 A | * 7/2000 | Lemke et al. ............... 439/341 |

FOREIGN PATENT DOCUMENTS

| | | |
|---|---|---|
| EP | 0 392 629 | 10/1990 |
| EP | 0 905 826 A2 | 3/1999 |
| EP | 0 924 806 | 6/1999 |
| NL | 850043 | 1/1985 |
| WO | WO 98/15989 | 4/1998 |

OTHER PUBLICATIONS

Greathouse, S., "Self–Centering of BGAs and Solder Interconnects," *Electronic Packaging & Production*, Aug. 1997, pp. 65–72.

* cited by examiner

*Primary Examiner*—Neil Abrams
*Assistant Examiner*—J. F. Duverne
(74) *Attorney, Agent, or Firm*—Woodcock Washburn LLP

(57) ABSTRACT

A modular construction of connectors is provided for reducing the effects of the differential coefficient of thermal expansion of the connectors and the underlying circuit board. Each connector of the modular construction is mounted on a known circuit board or the like and could receive therein an integrated circuit chip carrier or could mount to another board. The principle of solder surface tension and self-centering characterized in ball grid array (BGA) surface mount technology is used to form an array connector having multiple components that form a larger array pattern or group of arrays.

25 Claims, 9 Drawing Sheets

MODULAR ELECTRICAL CONNECTOR

FIELD OF THE INVENTION

The present invention relates in general to a high density modular electrical connector and, more particularly, to a self-centering modular electrical connector which can be readily adapted to different contact counts and configurations.

BACKGROUND OF THE INVENTION

An interface connector is used to connect integrated circuit (IC) chips and IC chip carriers to known circuit boards or the like. IC chips and IC chip carriers typically have a plurality of pins or leads in an array on a surface thereof. The pins are received by associated passages in an interface connector which is then mounted to a circuit board, thereby putting the IC chips and IC chip carriers in electrical contact with the circuit board.

An adequate interface connector between an IC chip and other circuitry continues to be a challenge. The number of closely spaced leads which come from the chip must be able to interface in a relatively high density configuration. However, the wide variety of chip configurations that are available does not always lend itself to making a uniform connector in that there may be varying numbers of leads and various arrays of leads. The known connectors have generally been useful only for single IC chip configurations and are not readily adaptable for expansion and/or revision. Typical limitations to area array components include coefficient of thermal expansion (CTE) mismatch, coplanarity or moldability problems (which is the ability to repeatably manufacture a component using a molding process such as thermoplastic molding), and high mating forces and component alignment.

Regarding the problem of CTE mismatch, area array components such as connectors, devices, and packages, are limited in size based on the materials that form the various components. The different CTEs and the size of the components affect the performance and reliability of the electrical connections after thermal cycling. The greater the differential displacements created by CTE mismatch during thermal changes, the greater concern for the electrical integrity of the system.

Regarding mating force, simultaneous parallel mating of the contacts can cause a high peak mating force when compared to other mating techniques. In high density applications, the connector housing and substrate materials may not be sufficiently rigid to adequately accommodate these peak forces.

Although the art of connectors is well developed, there remain some problems inherent in this technology. Therefore, a need exists for a modular interface connector that overcomes the drawbacks of conventional connectors.

SUMMARY OF THE INVENTION

The present invention is directed to a modular construction of connectors for reducing the effects of the differential coefficient of thermal expansion of the connectors and the underlying circuit board. Each connector of the modular construction in accordance with the present invention is mounted on a known circuit board or the like and could receive therein an integrated circuit chip carrier or could mount to another board. The present invention uses the principle of solder surface tension and self-centering characterized in ball grid array (BGA) surface mount technology to form an array connector having multiple components that form a larger array pattern or group of arrays.

The foregoing and other aspects of the present invention will become apparent from the following detailed description of the invention when considered in conjunction with the accompanying drawings.

BRIEF DESCRIPTION OF THE DRAWINGS

FIG. 10 is a top perspective view of another embodiment of the connector of the present invention mating with a suitable mating connector.

DESCRIPTION OF EXEMPLARY EMBODIMENTS AND BEST MODE

The present invention is directed to a modular construction for reducing the effects of the differential in the coefficient of thermal expansion of the substrate (e.g., a circuit board) and the connector. The connector in accordance with the present invention is surface mounted on a known circuit board or the like and receives therein a mating component, such as another connector or a known integrated circuit chip carrier. The present invention uses the principle of solder surface tension and self-centering characterized in, for example, ball grid array (BGA) surface mount technology to form an array connector having multiple components that form a larger array pattern or group of arrays.

One of the main advantages of the bump solder array interconnect process used in BGA is the "self-centering" phenomenon that occurs during reflow soldering. Taking advantage of this characteristic results in tremendous increases in assembly yields.

The self-centering phenomenon is now described. A solder ball on a module is placed over a pad on a circuit board. The solder is heated and during reflow, flux activates the surface and the solder paste forms a dome. The surfaces wet and a solder meniscus forms. The solder begins a liquidus phase and then the ball and paste join to form a solder structure. Surface tension begins to exert a pull on the pad surfaces and continues to build, thereby exerting pulling force on surfaces. The surfaces begin to move. The solder joints are pulled to an equilibrium position balanced between the top and bottom of the joints.

Figure 1:
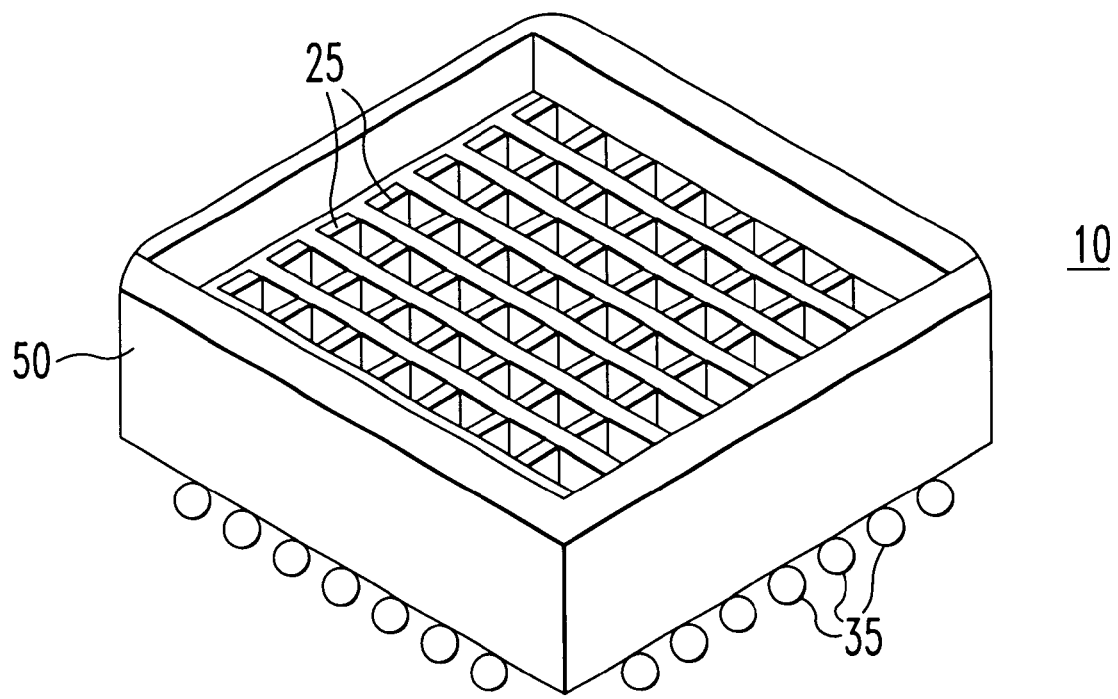
FIG. 1 is a perspective view of a conventional BGA interface connector.
Figure 2:
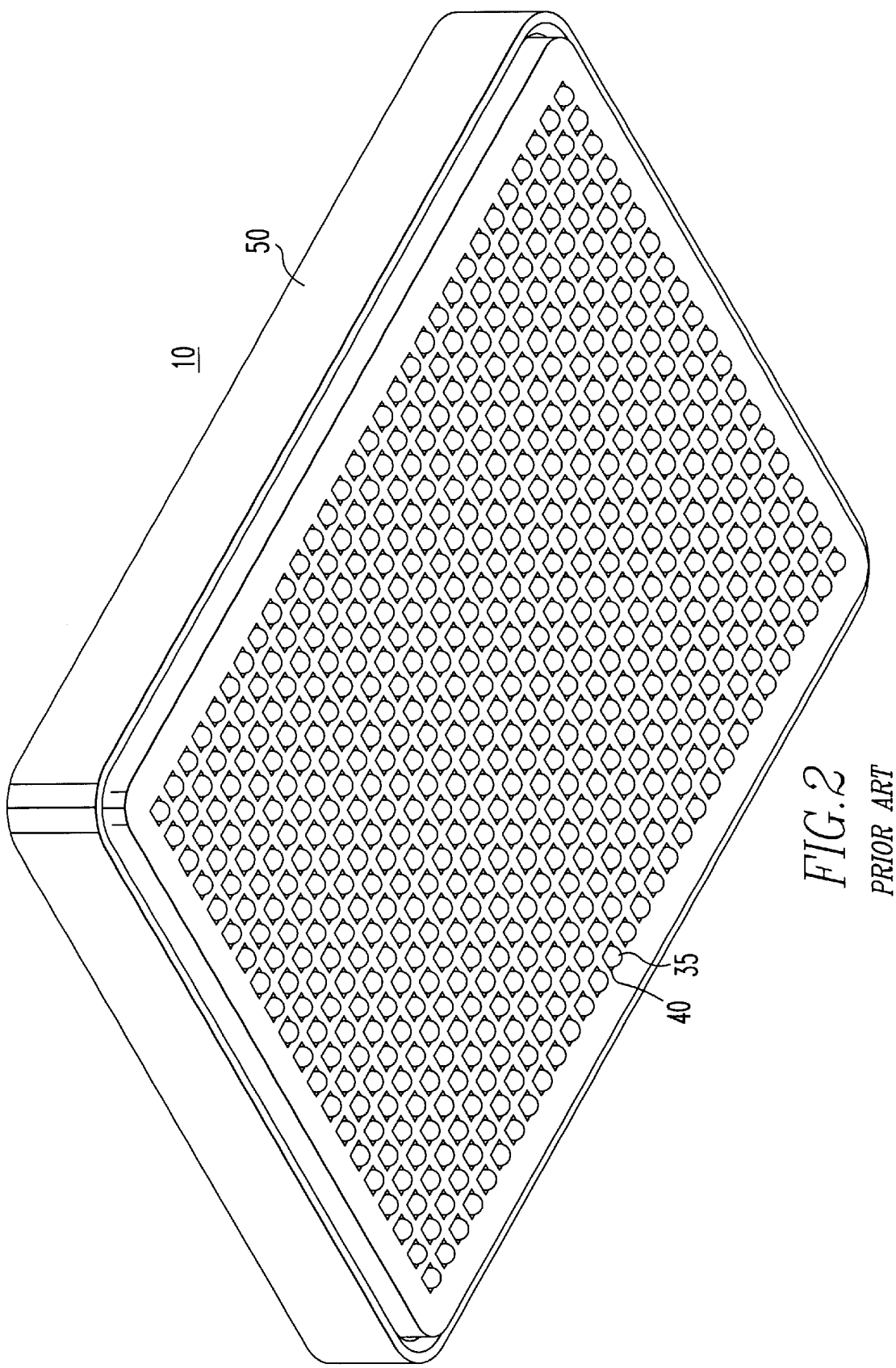
FIG. 2 is a bottom perspective view of the conventional BGA interface connector of FIG. 1.

A perspective view of a conventional interface connector 10, such as a BGA connector, is shown in FIG. 1, and FIG.

2 is a bottom perspective view of the conventional interface connector 10. The connector 10 provides a board-to-board interconnection. The connector 10 preferably mounts to a substrate (e.g., a circuit board) using reflow techniques, in particular, BGA technology. An exemplary connector is part number 74215 available from FCI Electronics.

A fusible element 35, such as a solderball, secures to a tail portion of a contact. The contacts are secured to the connector housing. The contacts can be stamped and formed, and comprise an electrically conductive material such as copper or copper plated with gold. The fusible elements 35 fuse to the contacts upon reflow, and can be at least partially contained within an aperture 40 of a housing 50.

The conductive solderballs 35 are metallurgically wetted to the contacts during a reflow process. More particularly, flux is applied to the aperture and/or the contact and the spherical solder balls 35 are attached thereto. The assembly generally is then inserted into a reflow furnace and heated. This causes the balls 35 to melt and wet onto the surfaces of their respective contacts and to assume a generally spherical shape. Conductive solder balls 35 are typically uniformly spaced a pitch apart, which is typically on the order of 1.0 to 1.8 mm although other spacing is possible.

International Publication number WO 98/15989 (International Application number PCT/US97/18066), herein incorporated by reference, describes further methods of securing a solder ball to a contact of a connector or a ball pad on a circuit substrate. The contacts form a series of rows and columns in the connector. The contacts preferably all have the same elevation. This simplifies the connection to an underlying substrate such as a printed circuit board.

The conductive solder balls 35 are connected to the underlying substrate or printed circuit board using a standard solder reflow process. The circuit board has a plurality of contact pads arranged in a pattern. Conductive solder balls 35 connect to the contact pads to form solder joints. After the mounting process, solder joints take a flattened spherical shape defined by solder volume, wetting areas, and a variety of other factors. The number and arrangement of conductive solder balls 35 on the lower surface of connector 10 depends on circuit requirements including input/output (I/O), power and ground connections.

More particularly, the BGA assembly 10 is connected to a previously manufactured circuit board which has an array of pads on it. Solder paste is screened (using a stencil and squeegee) onto the circuit board pads. A placement machine places the assembly 10 onto the tops of the solder paste, and the resulting construction is heated in a reflow furnace. The balls 35 then reflow onto the circuit board pads.

Any balls formed of solder that flows completely, i.e., melts completely and then resolidifies, or even partially reflows can be used. Examples are tin bismuths, 63-37 SnPb eutectic, and other newer solders which reflow at temperatures in the range of 183° C. The SnPb solder reflow processes used herein generally heat the balls 35 to a peak temperature of approximately 225° C. to 240° C.

The connector 10 can comprise a plurality of passageways 25 in which the contacts extend through the housing. Depending on the type of contact used, the connector 10 could mate with another connector, IC chips or IC chip carriers.

The connector 10 has a housing 50, manufactured from a preferably high temperature thermoplastic or other suitable dielectric material to act as a guide in mating the mating component for example. The housing 50 can include a wall disposed around the periphery of the connector 10.

The difference in the coefficient of thermal expansion (CTE) of the substrates and the connector, and the coplanarity of the fusible elements are two important considerations with large scale array connectors. CTE differential can introduce stress into the solder joints that couple the connector and the substrate. Solder joint stress potentially reduces the reliability of the connector. CTE differential can also warp the connector.

Connector warp potentially misaligns the mating connectors, which increases the required peak insertion force. Connector warp may also affect the coplanarity of the fusible elements that couple the connector to the substrate.

One of the main advantages of the bump solder array interconnect process used in BGA package arrays is the self-centering phenomenon that occurs during reflow soldering.

This characteristic results in tremendous increases in PCB yields. More particularly, the solder ball arrays to a certain extent are self-aligning, and thus if slightly misaligned on the pads they will automatically align during the reflow process. In other words, the surface tension properties of the solder of the balls cause the self-alignment. Alignment in the horizontal and vertical direction is not the only alignment that occurs in the self-centering action. There is a vertical alignment that occurs as a part of the settling of the component on the surface tension of the liquid solder. This alignment can partially compensate for package or circuit board warpage.

Figure 3:
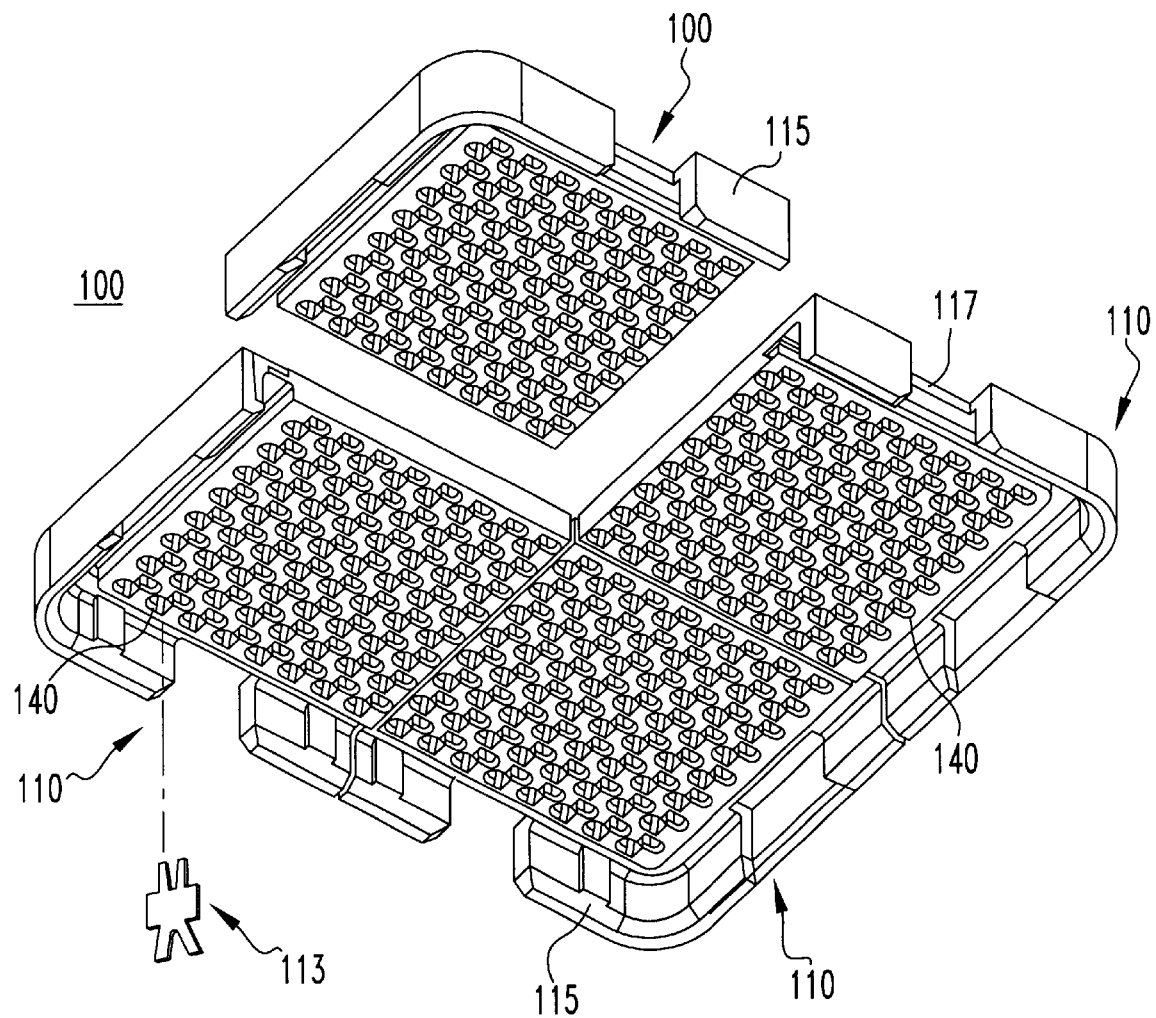
FIG. 3 is a top perspective view of an exemplary BGA interface connector, exploded, in accordance with the present invention.
Figure 4:
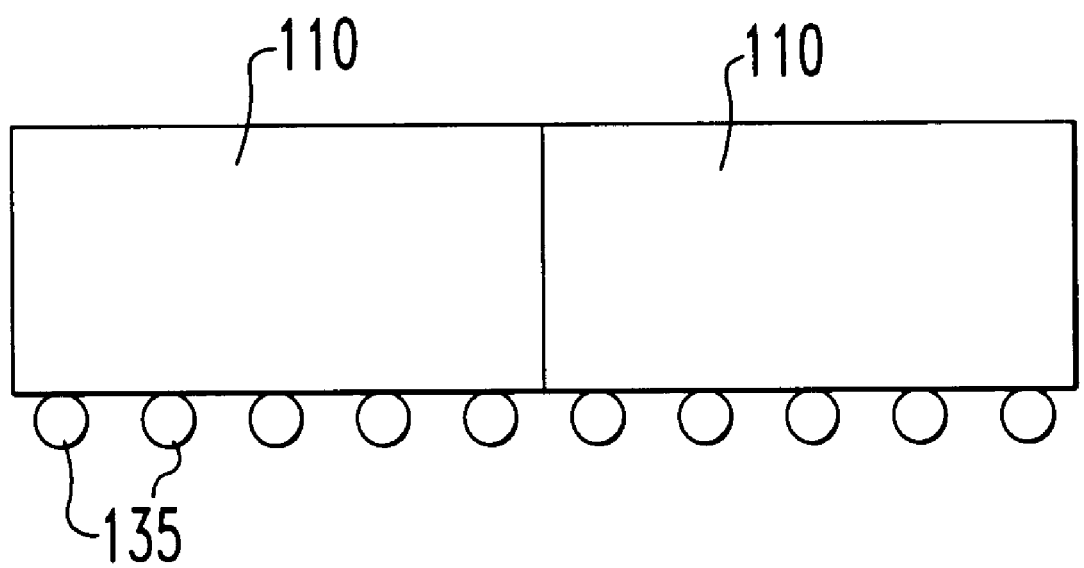
FIG. 4 is a side view of the BGA interface connector of FIG. 3.
Figure 5:
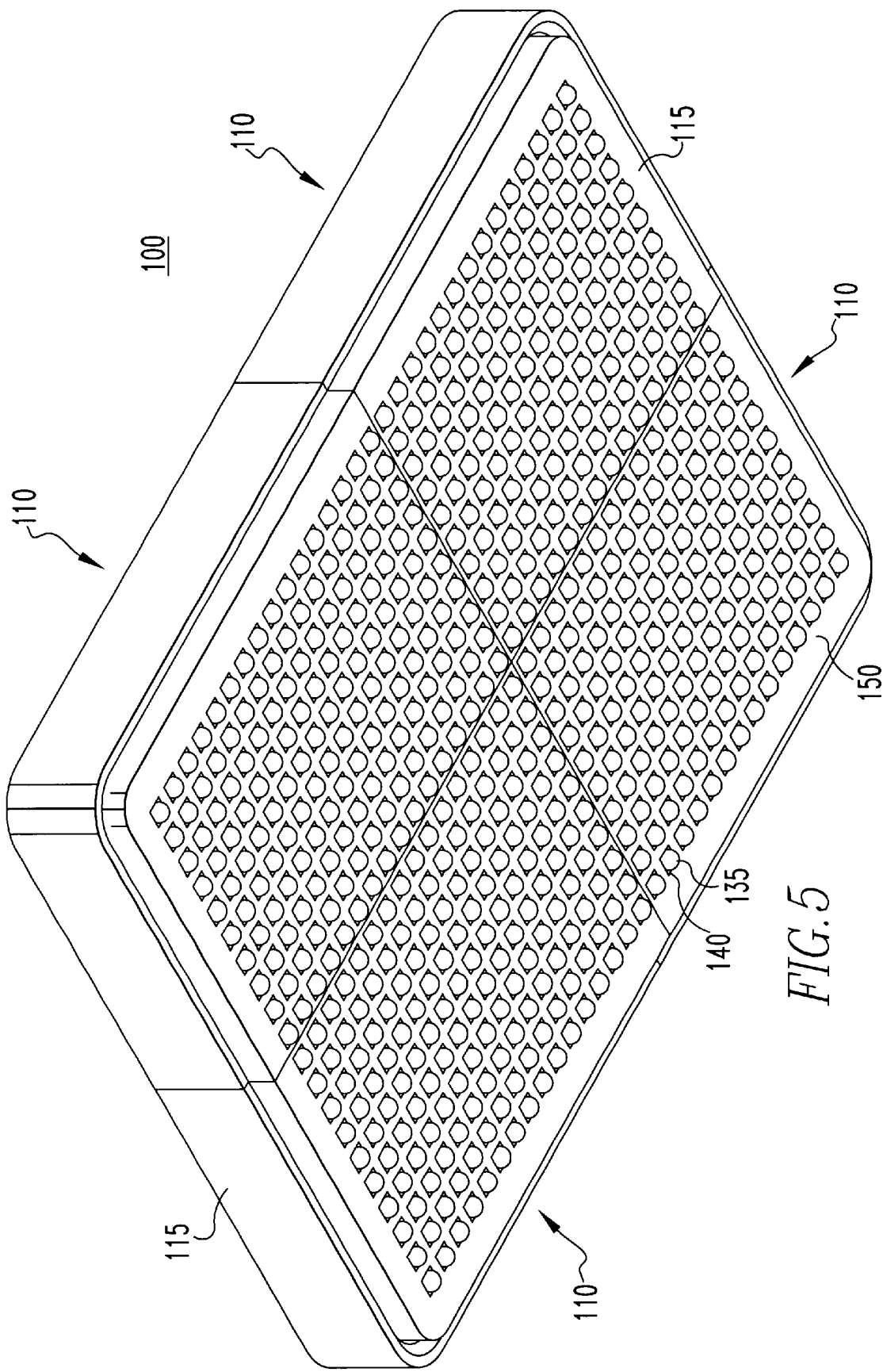
FIG. 5 is bottom perspective view of the-exemplary BGA interface connector of FIG. 3, assembled.

FIG. 3 is a top perspective view of an exemplary interface connector 100, exploded, in accordance with the present invention, FIG. 4 is a side view of the interface connector of FIG. 3, and FIG. 5 is bottom perspective view of the exemplary interface connector of FIG. 3, assembled. The interface connector 100 may be similar to the connector described in International Publication number WO 98/15989 (International Application number PCT/US97/18066), and herein incorporated by reference. The connector 100 is a modular array of a plurality of connectors 110 that are preferably non-interlocking. The individual connectors 110 can be directly neighboring each other so there are no rows of unused contacts between them on the underlying circuit board, as shown in FIGS. 3 and 5, or they can be spaced apart so there are rows of unused contacts between them (not shown).

The connector 110 typically has a plurality of apertures 140 through its surface for receiving contacts 113. The apertures 140 are typically disposed in an array arrangement. Furthermore, each connector 110 has a plurality of fusible elements 135, such as solder balls, disposed on a surface thereof, in an arrangement corresponding with the apertures 140. As shown in FIG. 5, the solder balls 135 are partially disposed within associated apertures 140 in the connector housing 150. The solder balls 135 are used for self-centering the connector 100 to an underlying substrate or printed circuit board. Each connector 110 preferably has a wall 115 around a portion of its periphery, so that when the modular connector 100 is fully assembled, the walls 115 form an enclosure around the periphery of the connector 100. The walls 115 can have keying features 117 for mating with another connector.

Thus, the present invention solves a reliability failure mechanism, CTE mismatch, by partitioning an interface connector into multiple smaller modular sections such that each modular component is reliable and positioned together to form a large array, Preferably, each component is de-coupled from the next and located through a principle of self-centering of the BGA attachment to form a larger array.

The present invention provides a completed array by positioning the components together so as not to interrupt any row or column (i.e., the contacts maintain the same pitch spacing) thus providing the most optimal electrical association with an array package or board array configuration. Unique array configurations can also be constructed such as depopulated areas such as peripheral array configurations, and clustered arrays in the form of small array groups located in close proximity to one another.

Figure 6:
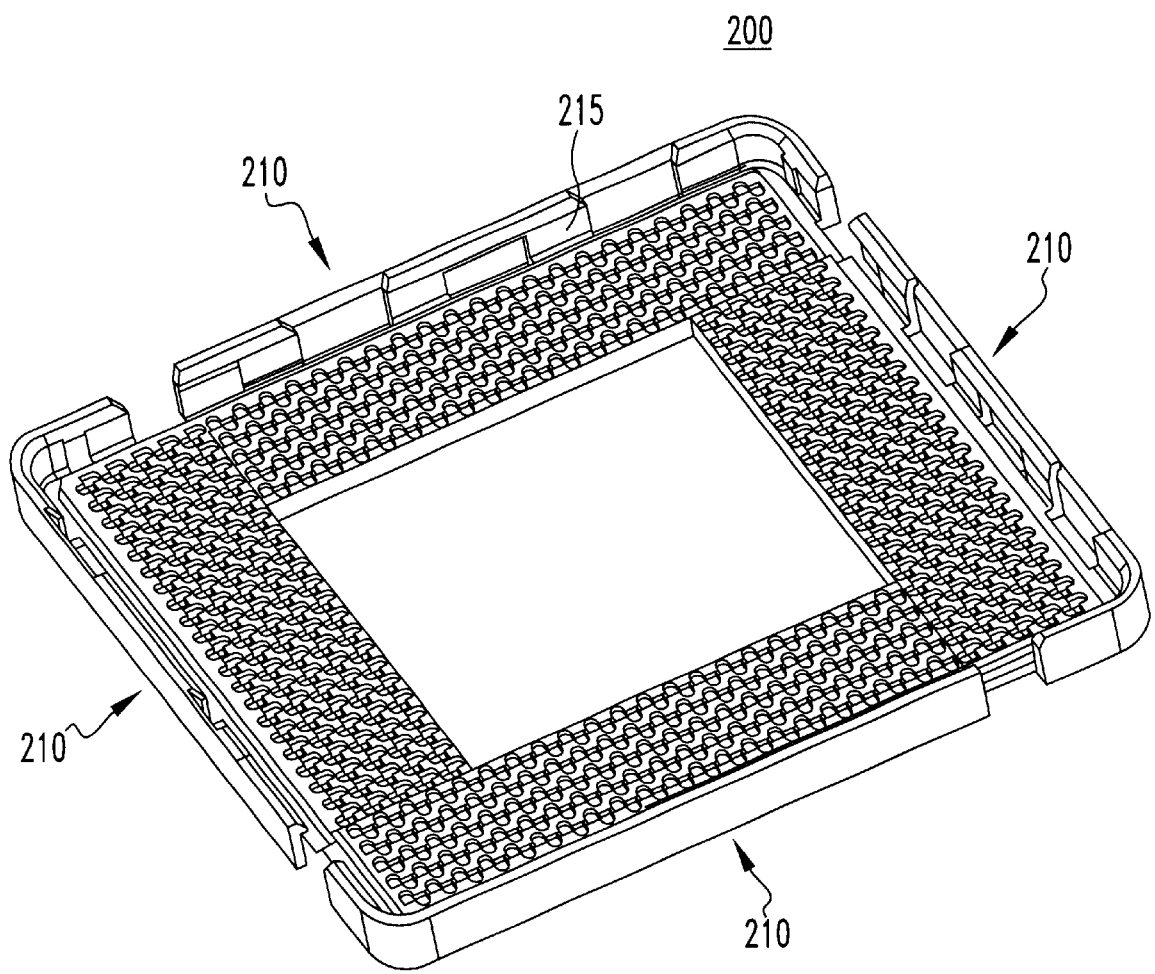
FIG. 6 is a top view of another exemplary interface connector in accordance with the present invention.

FIG. 6 is a top view of another exemplary interface connector 200 in accordance with the present invention. The connector 200 has a modular construction, but there are no contacts in a particular area (e.g., the center, as shown). More particularly, the connector 200 comprises a plurality of connectors 210 that are preferably non-interlocking. The individual connectors 210 can be directly neighboring each other so there are no rows of unused contacts between them on the underlying circuit board, or they can be spaced apart so there are rows of unused contacts between them, or even have empty space between them, as shown. Each connector 210 could include a perimeter wall or frame, such as wall 215 to define the perimeter of connector 200. Similar to the connectors described above, each connector 210 has a plurality of fusible elements, such as solder balls, disposed on a surface, for mating to an underlying substrate or circuit board.

Figure 7:
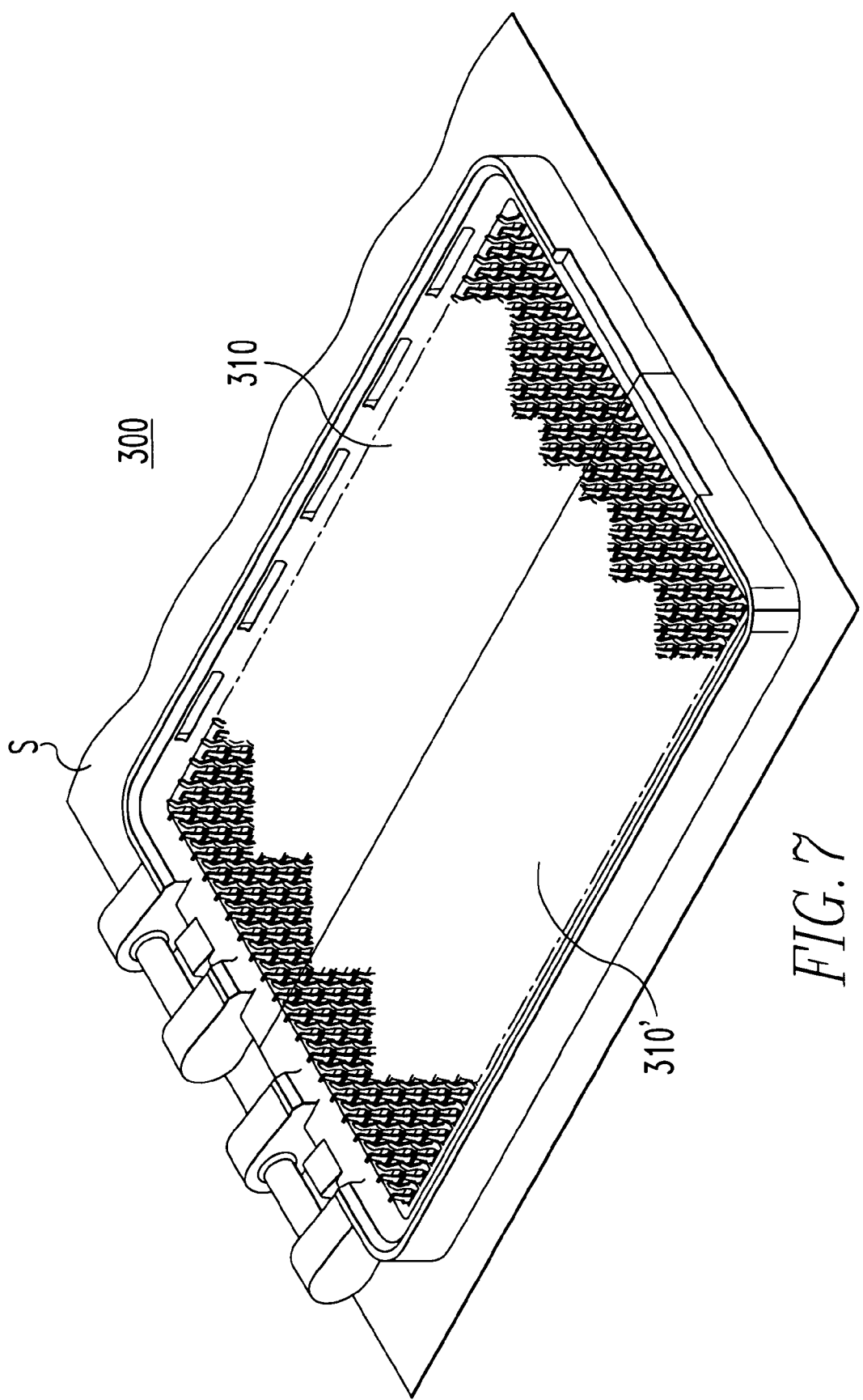
FIG. 7 is a top view of a further exemplary interface connector in accordance with the present invention.
Figure 8:
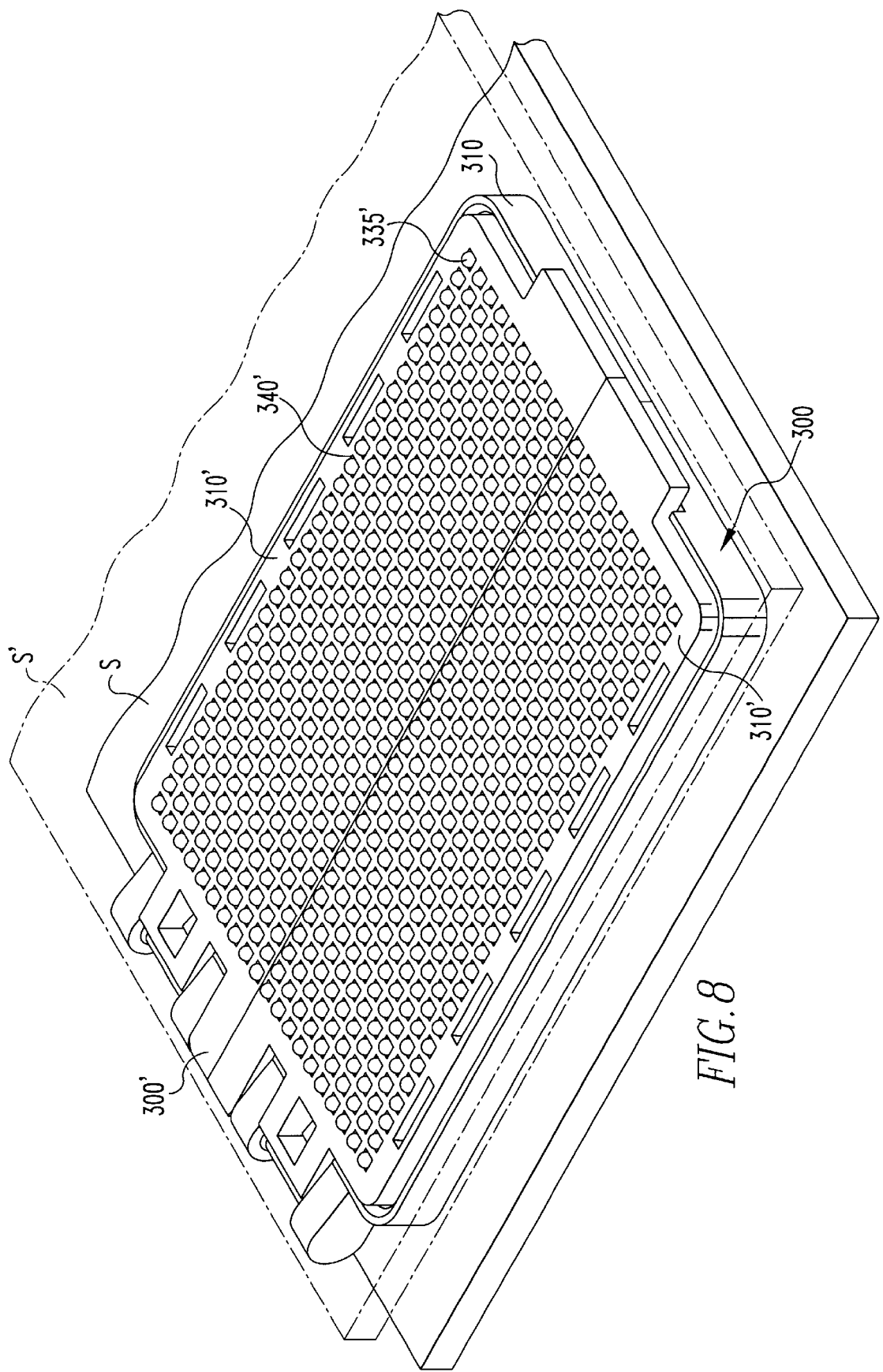
FIG. 8 is a top perspective view of the connector of FIG. 7 after mating with a mating connector.

FIG. 7 is a top view of a further exemplary interface connector 300 in accordance with the present invention mounted on a substrate S, and FIG. 8 is a top perspective view of the connector 300 in a mated condition with a mating connector 300', which is preferably mounted on a substrate S'. The interface connectors may be similar to the connector described in U.S. patent application Ser. No. 09/209,132, pending, and herein incorporated by reference. The connector 300/300' has a modular construction and comprises a plurality of connectors 310/310' that are non-interlocking and disposed in a side by side relationship. Similar to the connectors described above, each connector 310/310', has a plurality of fusible elements 335/335', such as solder balls, disposed on a surface, for mating to an underlying substrate or circuit board S/S'. The elements 335/335' can be disposed through apertures 340' in the housing of the connectors 310/310'. Although only two connectors 310/310' are shown for each connector 300/300', it is contemplated that any number of connectors can be incorporated into the connector 300/300'.

Figure 9:
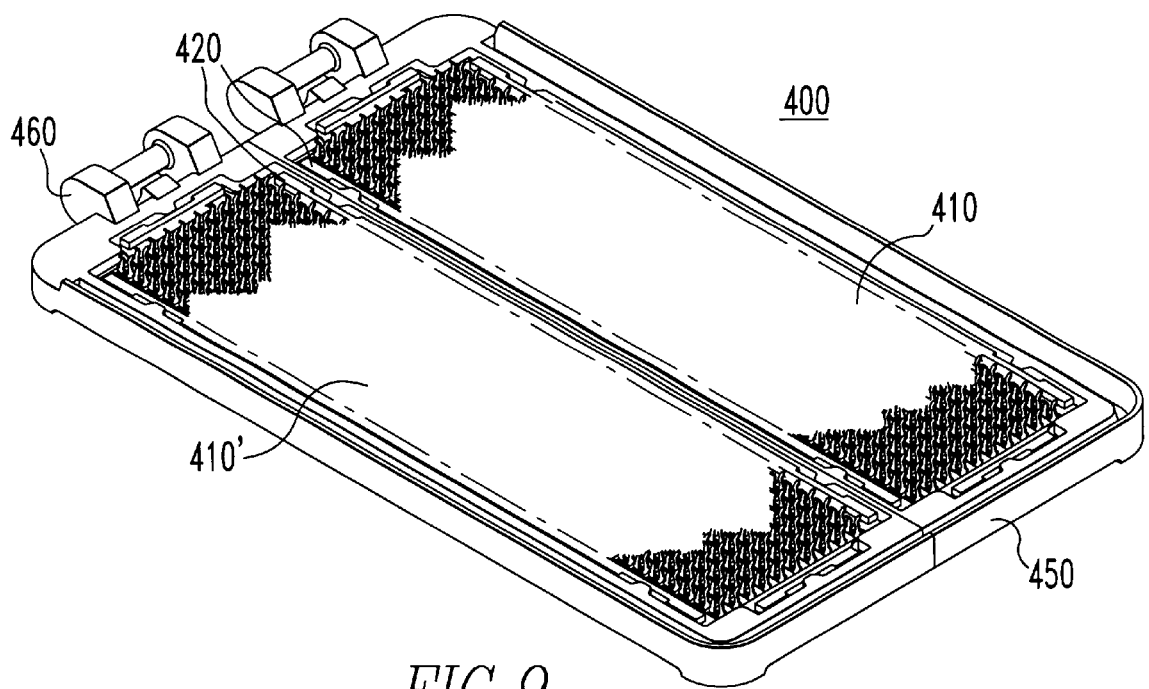
FIG. 9 is a top view of a further exemplary interface connector in accordance with the present invention.

In connector 300/300', there are no rows of unused contacts between the connectors 310/310'. In another exemplary interface connector 400/400', as shown in FIG. 9, there is unused space 420 between the connectors 410/410'. The unused space can receive one or more frames 450. Frames 450 can be soldered to substrate S and can help provide rigidity to the substrate S, help control the effects of CTE and can include hinge structure 460 to help align and mate a pair of connectors 400,400'. Various projections on frame 460 engages corresponding recesses in connectors 410/410' to seat connector 410/410' within frame 460.

The present invention addresses the effects of CTE mismatch by modularizing or splitting up the size of an array (e.g., connector 100) into smaller arrays or components (e.g., connectors 110) that have less differential displacements and therefore improved electrical performance and reliability.

The present invention addresses the issue of coplanarity and mold-ability (the ability to repeatably manufacture a component using a molding process such as thermoplastic molding) by modularizing or splitting up the size of an array into smaller arrays or components that can be produced flatter and easier through conventional molding processes.

FIG. 10 shows an alternative embodiment of the present invention. Similar to connectors 410,410' and frames 450/450' of FIG. 9, connector 500 mates with corresponding connector 500'. Each connector includes a plurality of smaller connector modules 510'. Modules 510' house contacts (now shown) to which fusible elements 535 secure. Fusible elements 535 preferably at least partially reside in recesses 540. A single frame 550' can surround modules 510 and not extend between modules 510 at unused space 520. As with the other embodiments, frame 550' could be any suitable material such as metal or plastic.

The problem with simultaneous parallel mating is the peak mating force is experienced simultaneously as all the contacts engage instantaneously. Connector mating forces are comprised in two stages; one is the initial mating where the beams deflect open and the contacts engage. This force is characterized by friction, contact angles and the normal forces of the engaging contacts. Stage two is characterized by dynamic sliding frictional forces.

The present invention addresses the issue of high mating forces through an angular mating concept or a pivoting mating concept such as that shown in FIGS. 7–10.

Features on the modular component or components assist in bringing the components together in an angular mating whereby the contacts are oriented to allow the plug contact to transverse into the receptacle contact without stubbing to engage each segment of contacts sequentially rather than simultaneously to reduce the peak insertion force by distributing these individual forces over a sequence of mating steps.

The modular components of the present invention can provide overall mating alignment of multiple components by providing features on certain components that work together or function individually as features to provide the desired mating alignment for successful mating of the complete assembly.

This concept relies on an accurate positional relationship of the solder ball and the contact to maintain the mating conditions desirable for the individual components to align for successful mating. This is preferably achieved by the contact tip protruding into a ball cavity such that the solder will equally surround the contact tip to facilitate this relationship.

Although the present invention has been described with respect to BGAs, other packages, such as $\mu$BGA and other chip scale grid array (CSGA) type packages, flip chip, and C4 type connections can also be used with the present invention.

Although illustrated and described herein with reference to certain specific embodiments, the present invention is nevertheless not intended to be limited to the details shown. Rather, various modifications may be made in the details within the scope and range of equivalents of the claims and without departing from the invention.

What is claimed:

1. An electrical connector mountable on a substrate, comprising:
   a plurality of modules, each module having:
      a housing having an edge;
      a wall around a portion of a periphery; and
      a plurality of surface mount contacts in said housing and arranged in rows having a pitch distance therebetween;

wherein said modules are mountable to the substrate so that said edge of one of said modules is adjacent said edge of another of said modules and one of said rows of contacts on one of said modules is located a distance from one of said rows of contacts on another of said modules approximately equal to said pitch distance, and wherein said walls of said modules are disposed to form an enclosure around the connector.

2. The connector mountable on the substrate according to claim 1, wherein each of said surface mount contacts comprises a fusible element.

3. The connector mountable on the substrate according to claim 1, wherein said modules are mountable to the substrate using self-centering and surface tension of said surface mount contacts.

4. The connector mountable on the substrate according to claim 1, wherein each module comprises a plurality of apertures, each aperture for receiving an associated one said plurality of surface mount contacts.

5. The connector mountable on the substrate according to claim 1, wherein said modules are non-interlocking.

6. The connector mountable on the substrate according to claim 1, wherein each of said walls comprises a keying feature.

7. An electrical connector having two portions, at least one of said two portions physically and electronically connected to a substrate and resistant to CTE mismatch between said connector and said substrate and comprising:
   a plurality of individual modules having:
   a housing;
   at least one contact in said housing; and
   a fusible surface mount element for physically and electronically connecting said housing and said contact to said substrate;
   wherein said plurality of said individual modules define the CTE resistant connector portion.

8. The connector according to claim 7, wherein each of said contacts is a surface mount contact comprising a fusible element.

9. The connector according to claim 7, wherein each of said housings comprises an aperture for receiving said contact, said contact being at least partially disposed within said aperture.

10. The connector according to claim 7, wherein said modules are non-interlocking.

11. The connector according to claim 7, wherein each of said extensions comprises a keying feature.

12. The connector according to claim 7, wherein each of said housings comprises a plurality of contacts arranged in rows having a pitch distance therebetween.

13. The connector according to claim 12, wherein one of said rows of contacts on one of said modules is located a distance from one of said rows of contacts on another of said modules approximately equal to said pitch distance.

14. A method of making an electrical connector having two portions, comprising:
   providing a circuit substrate having an array of surface-mount conductive pads; and
   surface-mounting, using heat, a plurality of individual modules having a housing having a wall around a portion of a periphery and at least one contact in said housing to corresponding sections of said array of conductive pads so that said plurality of individual modules define the connector portion and said walls combine to form an enclosure around the connector.

15. The method according to claim 14, wherein each of said modules comprises a plurality of rows of surface mount contacts having a pitch distance therebetween corresponding to said array of conductive pads, said step of mounting said modules comprises reflow soldering said surface mount contacts to said conductive pads.

16. The method according to claim 15, wherein said reflow soldering comprises self-centering to align said surface mount contacts and said conductive pads.

17. The method according to claim 15, wherein one of said rows of contacts on one of said modules is located a distance from one of said rows of contacts on another of said modules approximately equal to said pitch distance.

18. An electrical connector, comprising:
   a plurality of modules, each module having:
   a housing;
   a contact in said housing; and
   an extension projecting from said housing;
   wherein said extensions of said modules define a perimeter of the connector, wherein each of said housings comprises a plurality of contacts arranged in rows having a pitch distance therebetween,
   wherein one of said rows of contacts on one of said modules is located a distance from one of said rows of contacts on another of said modules approximately equal to said pitch distance.

19. A method of making an electrical connector, comprising:
   providing a circuit substrate having an array of conductive pads; and
   mounting a plurality of generally independent modules, each of said modules having a wall around a portion of a periphery, to corresponding sections of said array of conductive pads so that said walls are disposed to form an enclosure around the connector,
   wherein said plurality of modules define the connector,
   wherein each of said modules comprises a plurality of rows of surface mount contacts having a pitch distance therebetween corresponding to said array of conductive pads, said step of mounting said modules comprises reflow soldering said surface mount contacts to said conductive pads.

20. The connector according to claim 7, wherein one module is positioned immediately adjacent the other module.

21. The connector according to claim 7, wherein one module is in direct contact with another module.

22. The connector according to claim 7, wherein a change in physical characteristics of one module does not affect the physical characteristics of the other module.

23. The method according to claim 14, further comprising positioning one module immediately adjacent the other module.

24. The method according to claim 14, further comprising positioning one module in direct contact with another module.

25. The method according to claim 14, wherein a change in physical characteristics of one module does not affect the physical characteristics of the other module.

* * * * *